(12) United States Patent
Ono et al.

(10) Patent No.: US 7,101,801 B2
(45) Date of Patent: Sep. 5, 2006

(54) METHOD OF MANUFACTURING SEMICONDUCTOR DEVICE USING CHEMICAL MECHANICAL POLISHING

(75) Inventors: Takatoshi Ono, Odawara (JP); Naohito Mizuno, Oita (JP); Yoshikuni Tateyama, Oita (JP); Tomoyuki Hirano, Anjo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/704,628

(22) Filed: Nov. 12, 2003

(65) Prior Publication Data

US 2004/0152316 A1  Aug. 5, 2004

(30) Foreign Application Priority Data

Nov. 12, 2002 (JP) .............................. 2002-328414

(51) Int. Cl.
*H01L 21/302* (2006.01)

(52) U.S. Cl. ........................ 438/693; 438/690

(58) Field of Classification Search ................ 438/690, 438/692, 693
See application file for complete search history.

(56) References Cited

U.S. PATENT DOCUMENTS

| | | | | |
|---|---|---|---|---|
| 5,985,748 A * | 11/1999 | Watts et al. | ................. | 438/622 |
| 6,191,037 B1 | 2/2001 | Robinson et al. | | |
| 6,340,434 B1 | 1/2002 | Mizuno et al. | | |
| 6,429,134 B1 | 8/2002 | Kubota et al. | | |
| 6,468,911 B1 | 10/2002 | Miyashita et al. | | |
| 2002/0095872 A1 * | 7/2002 | Tsuchiya et al. | ............... | 51/307 |

FOREIGN PATENT DOCUMENTS

| | | | | |
|---|---|---|---|---|
| CN | 1370811 A | 9/2002 | | |
| JP | 8-139060 | 5/1996 | | |
| JP | 411340173 A * | 12/1999 | ................. | 438/462 |
| JP | 2001-057352 | 2/2001 | | |
| JP | 2002-83787 | 3/2002 | | |
| JP | 2002-118084 | 4/2002 | | |

OTHER PUBLICATIONS

Notification of Reasons for Rejection in the First Examination issued by the Chinese Patent Office, dated Nov. 4, 2005, for Chinese Application No. 200310103596, and English-language translation thereof.

Notification of Reasons for Rejection issued by the Japanese Patent Office for Japanese Patent Application Serial No. 2002-328414 and English translation thereof.

Notification of Reasons for Rejection issued by Japanese Patent Office mailed Mar. 22, 2006, in Japanese Application No. 2002-328414, and English translation of Notice.

* cited by examiner

*Primary Examiner*—Bradley K. Smith
(74) *Attorney, Agent, or Firm*—Finnegan, Henderson, Farabow, Garrett & Dunner, L.L.P.

(57) ABSTRACT

A method for manufacturing a semiconductor device, which includes performing a first chemical mechanical polishing of a surface of an object having an uneven surface by making use of a first polishing liquid containing abrasive particles and a surfactant, and performing a second chemical mechanical polishing of the surface of the object that has been polished by the first chemical mechanical polishing by making use of a second polishing liquid containing abrasive particles and having a concentration of a surfactant lower than that of the first polishing liquid, wherein the first chemical mechanical polishing is switched to the second chemical mechanical polishing when the uneven surface of object is flattened.

20 Claims, 4 Drawing Sheets

METHOD OF MANUFACTURING SEMICONDUCTOR DEVICE USING CHEMICAL MECHANICAL POLISHING

CROSS-REFERENCE TO RELATED APPLICATIONS

This application is based upon and claims the benefit of priority from the prior Japanese Patent Application No. 2000-328414, filed Nov. 12, 2002, the entire contents of which are incorporated herein by reference.

BACKGROUND OF THE INVENTION

1. Field of the Invention

The present invention relates to a method of manufacturing a semiconductor device. In particular, the present invention relates to a chemical mechanical polishing (CMP) technique to be employed in the step of isolating elements of a semiconductor device such as a system LSI, a high-speed LSI, etc.

2. Description of the Related Art

In recent years, in order to meet the trend to further enhance the fineness of semiconductor elements, various fine working techniques have been developed. Among them, the employment of the CMP technique is now considered indispensable in forming a buried flat structure.

For example, the CMP technique is employed on the occasion of forming a shallow trench isolation (STI) structure in a system LSI, a high-speed LSI, etc., wherein CMP of an oxide film is performed using a nitride film as a stopper. However, there are various problems as described below.

(1) Since it is difficult to detect the end point of the polishing, the polishing is inadvertently continued even after the nitride film employed as a stopper has been entirely exposed, thus rendering the nitride film to be excessively polished, resulting in non-uniformity in thickness of the nitride film within a single chip.

(2) Since it is difficult to detect the end point of the polishing, the polishing may be terminated prior to the moment where the nitride film employed as a stopper is entirely exposed and, due to insufficient polishing, oxide film may be left on the surface of the nitride film.

(3) Due to the influences by the fluctuation in structure of a polished surface prior to CMP, such as the thickness of a silicon oxide film and the height of steps formed on the surface of a silicon substrate, or due to the influences by the fluctuation of polishing speed of CMP, the thickness of the silicon oxide film resulting from CMP as well as the optimum polishing time are caused to fluctuate.

(4) Since scratches generated during CMP are permitted to remain even after the CMP, the properties of semiconductor elements are caused to deteriorate.

As means for solving these problems, there is conventionally known a method wherein the magnitude of electric current of the motor of the turn table of the polishing apparatus is monitored and, based on the magnitude of electric current, the end point of polishing is determined (for example, U.S. Pat. No. 6,191,037).

As another conventional means for solving these problems, there is also known a method wherein a first polishing in which it is easy to detect the end point is performed initially, thus detecting the end point, after which an additional second polishing is performed (for example, U.S. Pat. No. 6,340,434). Additionally, there is also known a method wherein a first polishing for flattening a metal layer is performed initially, after which a second polishing using a reduced quantity of a abrasive particles is performed to thereby bury a metal layer in a trench (for example, U.S. Pat. No. 5,985,748).

However, any one of these conventional methods is incapable of solving all of the aforementioned problems.

BRIEF SUMMARY OF THE INVENTION

According to one aspect of the present invention, there is provided a method for manufacturing a semiconductor device, which comprises: performing a first chemical mechanical polishing of a surface of an object having an uneven surface by making use of a first polishing liquid containing abrasive particles and a surfactant; and performing a second chemical mechanical polishing of the surface of the object, which was subjected to the first chemical mechanical polishing, by making use of a second polishing liquid containing abrasive particles and having a concentration of a surfactant lower than that in the first polishing liquid; wherein the first chemical mechanical polishing is switched to the second chemical mechanical polishing at a moment when the uneven surface of object is flattened.

DETAILED DESCRIPTION OF THE INVENTION

Next, the method of manufacturing a semiconductor device according to one embodiment of the present invention will be explained in detail with reference to drawings.

In the step of CMP to be employed in the process of isolating semiconductor elements of a semiconductor device, it is required to accomplish two roles, i.e. the flattening of a silicon oxide film and the removal of residual portions of silicon oxide film until a silicon nitride film is entirely exposed.

The polishing of a silicon oxide film by making use of a polishing liquid containing ceria as abrasive particles and a surfactant can be most suitably utilized in the step of flattening the silicon oxide film because projected portions of pattern can be preferentially removed. However, this polishing method is not suited to removing the residual portion of a silicon oxide film formed on the surface of a silicon nitride film because the polishing rate is relatively slow after the aforementioned flattening and scratches are liable to be generated in the polishing process. Although it is desirable to employ a polishing method which is capable of polishing at a higher polishing rate, if the polishing is continued longer than required, the silicon nitride film employed as a stopper may also be polished, thus increasing in non-uniformity of film thickness within a single semiconductor chip.

Therefore, it is desired to perform the CMP step in the element isolation process in such a manner that a plurality of polishing liquids differing in characteristics from each other are employed for performing the polishing of different surfaces differing in polishing characteristics, these different polishing methods being switched with a suitable timing.

In the method according to one embodiment of the present invention, two polishing liquids differing in concentration of surfactant are switched. More specifically, a first chemical mechanical polishing is performed using a first polishing liquid and then, a second chemical mechanical polishing is performed using a second polishing liquid having a lower concentration of surfactant than that of the first polishing liquid, thereby making it possible to perform the polishing which is higher in polishing rate and more excellent in etching selection.

According to another embodiment of the present invention, the second chemical mechanical polishing is performed using a second polishing liquid having a lower concentration of abrasive particles than that of the first polishing liquid employed in the first chemical mechanical polishing.

The switching of polishing from the first chemical mechanical polishing to the second chemical mechanical polishing can be performed in such a manner that under the condition where a polishing liquid is placed on a polishing cloth, water is added to the polishing liquid to thereby reduce the concentration of a surfactant included in the polishing liquid.

As for the object (i.e. object to be polished), it may be formed of a silicon substrate, the surface of which has recessed portions and is entirely covered with a silicon nitride film except the recessed portions and further entirely covered thereon with a silicon oxide film in a manner to fill the recessed portions with the silicon oxide film, wherein the surface of the silicon oxide film is flattened by the first chemical mechanical polishing and the surface of the silicon nitride film is entirely exposed by the second chemical mechanical polishing.

In any of the methods according to the embodiments of the present invention, the first chemical mechanical polishing as well as the second chemical mechanical polishing can be performed in such a manner that an end point of ascent and an end point of descent are detected from a curve representing changes with time of the magnitude of electric current of the rotating motor of polishing table or from a curve representing changes with time of the magnitude of electric current of the rotating motor of a press head, and, based on these end points of ascent and descent, an optimum timing for switching the first chemical mechanical polishing to the second chemical mechanical polishing as well as the timing for finishing the polishing are determined. As a result, the polishing time of the first chemical mechanical polishing as well as the polishing time of the second chemical mechanical polishing can be easily determined.

In this case, a first boundary point and a second boundary point are detected from a curve representing changes with time of the magnitude of electric current of the motors, the first boundary point is assumed as the end point of ascent to thereby determine the polishing time of the first polishing and the second boundary point is assumed as the end point of descent to thereby determine the polishing time of the second polishing.

As described above, when the polishing is to be performed on an object formed of a silicon substrate having a trench and being covered with a silicon nitride film except the trench and further entirely covered with a silicon oxide film to fill the trench with the silicon oxide film, wherein the surface of the silicon oxide film is flattened by the first chemical mechanical polishing and the surface of the silicon nitride film is entirely exposed by the second chemical mechanical polishing, the termination of the flattening of the silicon oxide film can be determined by the detection of the first boundary point, and the exposure of the entire surface of the silicon nitride film can be determined by the detection of the second boundary point.

In the aforementioned methods according to the embodiments of the present invention, any surfactant may be employed. Preferably, an anionic surfactant may be employed.

Further, it is possible to employ ceria ($CeO_2$) particles as the abrasive particles. Although other kinds of abrasive particles such as silica particles and alumina particles may be employed as the abrasive particles, the employment of ceria particles is preferable.

One of preferable examples of the polishing liquid is one which comprises an anionic surfactant such as ammonium polyacrylate in particular as a surfactant and ceria particles as abrasive particles.

Next, specific embodiments of the present invention will be explained.

Figure 1A:
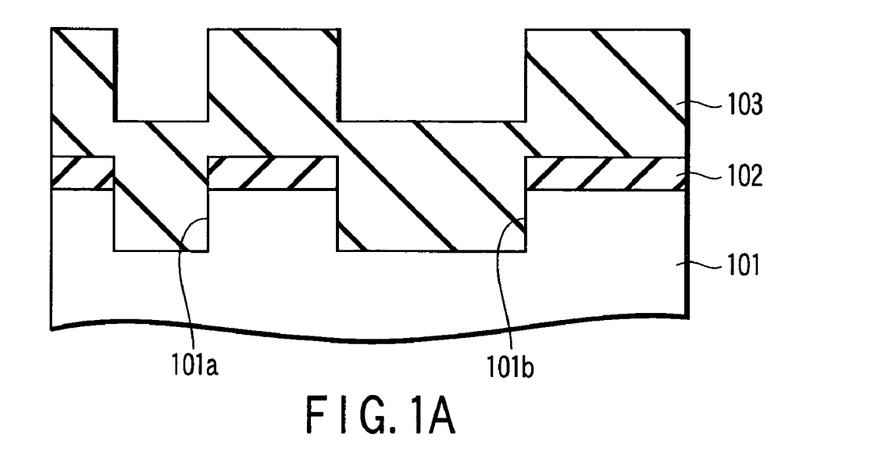
FIGS. 1A to 1C are cross-sectional views illustrating the process for forming an element isolation according to one embodiment of the present invention.
Figure 1B:
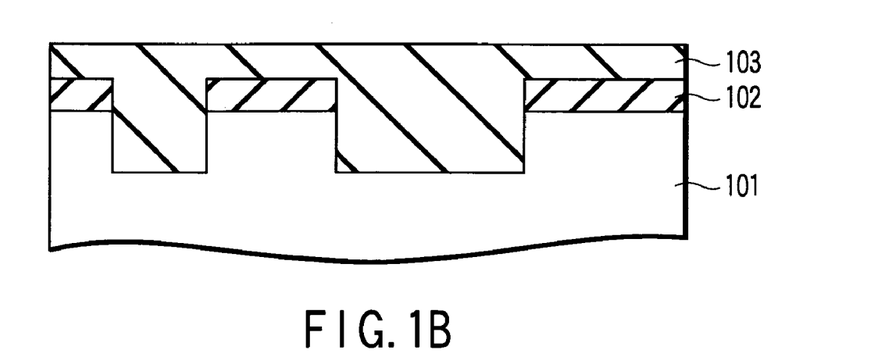
Figure 1C:
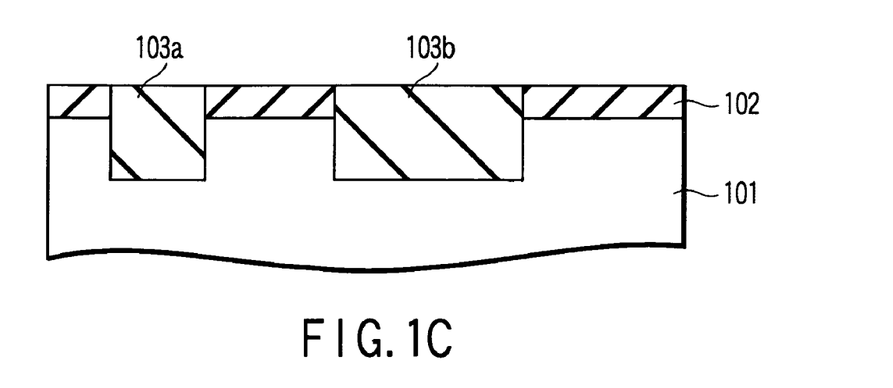

FIGS. 1A to 1C show cross-sectional views each illustrating the process of isolating semiconductor elements according to one embodiment of the present invention.

First of all, as shown in FIG. 1A, by means of the CMP method, a silicon oxide film 103 is deposited on the surface of a semiconductor substrate 100 having thereon trenches 101a and 101b and a silicon nitride film 102 formed in advance, thus filling the trenches with the silicon oxide film 103.

Then, as a first stage of polishing, the silicon oxide film 103 is polished by means of the CMP method. The polishing liquid to be employed in this CMP may be formed of an aqueous dispersion comprising, for example, 0.3 to 1.0% by weight of ceria as abrasive particles, and 0.94 to 3.5% by weight of an anionic surfactant. As for the anionic surfactant, it is possible to employ ammonium polyacrylate for instance.

By performing the CMP of the silicon oxide film 103, it is possible to obtain a flattened structure as shown in FIG. 1B. Then, by making use of a polishing liquid having a reduced concentration of the anionic surfactant, a second stage of polishing is performed until the surface of the silicon nitride film 102 is exposed as shown in FIG. 1C. It may be noted that the concentration of the abrasive particles may be reduced simultaneous with the reduction in concentration of the anionic surfactant.

As for the method of reducing the concentration of the surfactant, it is possible to employ a method wherein the polishing liquid employed in the first stage of polishing is switched to another kind of polishing liquid having a decreased concentration of the surfactant; a method wherein pure water added to the polishing liquid employed in the first stage of polishing; or a method wherein the supply of the polishing liquid employed in the first stage of polishing is stopped and then, pure water is supplied in place of the polishing liquid.

The concentration of the surfactant in the polishing liquid in the second stage may preferably be confined to 0.92% by weight or less, more preferably to the range of 0.08 to 0.62% by weight. Further, the concentration of the abrasive particles may preferably be confined to 0.5% by weight or less, more preferably to the range of 0.05 to 0.25% by weight.

When the polishing in the second stage is performed using a polishing liquid containing a decreased concentration of the surfactant, it is possible to secure a polishing selectivity between the silicon oxide film and the silicon nitride film. Namely, the polishing of the silicon oxide film can be performed at a faster polishing rate without substantially permitting the polishing of the silicon nitride film. As a result, it is possible to efficiently manufacture a semiconductor device which is excellent in uniformity in film thickness and minimal in generation of scratches and hence minimal in deterioration of properties.

Incidentally, when the polishing rate is excessively increased due to the reduction in concentration of the surfactant, it may be preferable to reduce the load of polishing or to reduce the concentration of the abrasive particles so as to control the polishing rate.

Next, the method of determining an optimum timing for switching the chemical mechanical polishing in the first stage to the chemical mechanical polishing in the second stage as well as the timing for finishing the polishing on the basis of a curve representing changes with time of the magnitude of electric current of the motor in the aforementioned embodiment will be explained with reference to FIGS. 1A to 1C in the same manner as the aforementioned embodiment.

First of all, as shown in FIG. 1A, by means of the CMP method, a silicon oxide film 103 is deposited on a semiconductor substrate 100 having trenches 101a and 101b and a silicon nitride film 102 formed on the portion except the trenches, thus filling the trenches with the silicon oxide film 103. As shown in FIG. 1A, the surface of the silicon oxide film 103 is roughened, forming a recessed/projected surface.

Then, as a first stage of CMP is performed to polish the surface of the silicon oxide film 103. This CMP is performed using a CMP apparatus which is capable of monitoring the magnitude of electric current of the motor of a turn table which is disposed to face a sample wafer or magnitude of electric current of the motor of a wafer press head.

Similar to the aforementioned embodiment, the polishing liquid to be employed in the CMP in the first stage may be formed of an aqueous dispersion containing, for example, 0.3 to 1.0% by weight of ceria as abrasive particles, and 0.94 to 3.5% by weight of an anionic surfactant. As for the surfactant, it is possible to employ an anionic surfactant such as ammonium polyacrylate for instance.

When the CMP of the silicon oxide film 103 is performed using this polishing liquid, it is possible to obtain a flattened structure as shown in FIG. 1B. On this occasion, the end point ascending in magnitude of electric current of motor is detected and the polishing of the first stage is stopped. Namely, as the surface of the silicon oxide film 103 is increasingly flattened due to the polishing thereof, the contacting area between the polishing cloth disposed on the turn table and the polished surface of the sample is gradually increased to thereby increase the frictional force therebetween. As a result, the torque of the turn table and of the wafer press head is caused to increase, thereby increasing the magnitude of electric current of these motors. Once a flattened structure is achieved, the contacting area between the polishing pad and the polishing surface of sample becomes maximum and the aforementioned frictional force is prevented from rising any more, thereby permitting the magnitude of electric current of the motor to take approximately a constant value.

The stoppage of the polishing in the first stage may be executed simultaneous with the detection of the end point of ascending in magnitude of electric current of the motor. Alternatively, the stoppage of the polishing in the first stage may be executed a predetermined time later.

Thereafter, under the condition where the concentration of the surfactant in the polishing liquid is lowered, the CMP in the second stage is performed until the surface of the silicon nitride film 102 is exposed as shown in FIG. 1C. As for the method of reducing the concentration of the surfactant in the polishing liquid, it is possible to employ, as described in the aforementioned embodiment, a method wherein a plural kinds of polishing liquids differing in concentration of the surfactant are prepared in advance and one of these polishing liquids is selected for the switching; a method wherein pure water is added to the polishing liquid employed in the first stage of polishing; or a method wherein the supply of the polishing liquid employed in the first stage of polishing is stopped and then, pure water is supplied in place of the polishing liquid.

The reduction in concentration of the surfactant may preferably be performed such that the surfactant may be included in the polishing liquid at a concentration of 0.62% by weight or less.

When the silicon oxide film 103 deposited on the silicon nitride film 102 is removed by CMP in the second stage to thereby initiate the exposure of silicon nitride film 102, the magnitude of electric current of the motor begins to descend. Then, when the silicon nitride film 102 is entirely exposed, the descent in magnitude of electric current of the motor is stopped, thereby permitting the electric current to take approximately a constant value. This end point of the descent is then detected to thereby stop the polishing in the second stage immediately after or a predetermined time after the detection of this end point of the descent. As a result, as shown in FIG. 1C, an STI structure having the silicon oxide films 103a and 103b buried in the trenches 101a and 101b, respectively, can be obtained.

The reason for the descent in magnitude of electric current of motor as the exposure of the silicon nitride film 102 is initiated in CMP in the second stage may be attributed to the fact that the object to be polished is caused to alter due to the exposure of the silicon nitride film 102.

When the concentration of the surfactant in the polishing liquid is lowered in this manner in the polishing of the second stage, the descent or fall in magnitude of electric current of motor due to the exposure of the silicon nitride film 102 can be more clearly identified. More specifically, when the concentration of ammonium polyacrylate, for example, in a polishing liquid is extremely decreased, a slight change in friction between the polished surface of the object and the polishing cloth is sufficiently transmitted to the torque of the turn table or to the torque of the wafer press head, thereby making it possible to easily detect the end point of exposure of the silicon nitride film 102.

According to the methods illustrated above, it is possible to accurately perform the detection of end point while enabling to maintain the flattening performance of the conventional technique. As a result, it is possible to prevent the generation of excessive or insufficient polishing of the object, thus making it possible to suppress the generation of residue of the silicon oxide film deposited on the silicon nitride film or the excessive polishing or excessive dishing of the silicon nitride film.

Next, specific examples of the embodiments of the present invention will be illustrated.

EXAMPLE 1

This example describes one example where the concentration of the surfactant in a polishing liquid is decreased without changing the concentration of the abrasive particles of the polishing liquid on the occasion of switching the polishing of the first stage to the polishing of the second stage.

In the polishing of the first stage, an aqueous dispersion comprising 0.5% by weight of ceria and 1.5% by weight of ammonium polyacrylate was employed as a polishing liquid. In the polishing of the second stage, an aqueous dispersion comprising 0.5% by weight of ceria and not containing a surfactant was employed as a polishing liquid.

Figure 2:
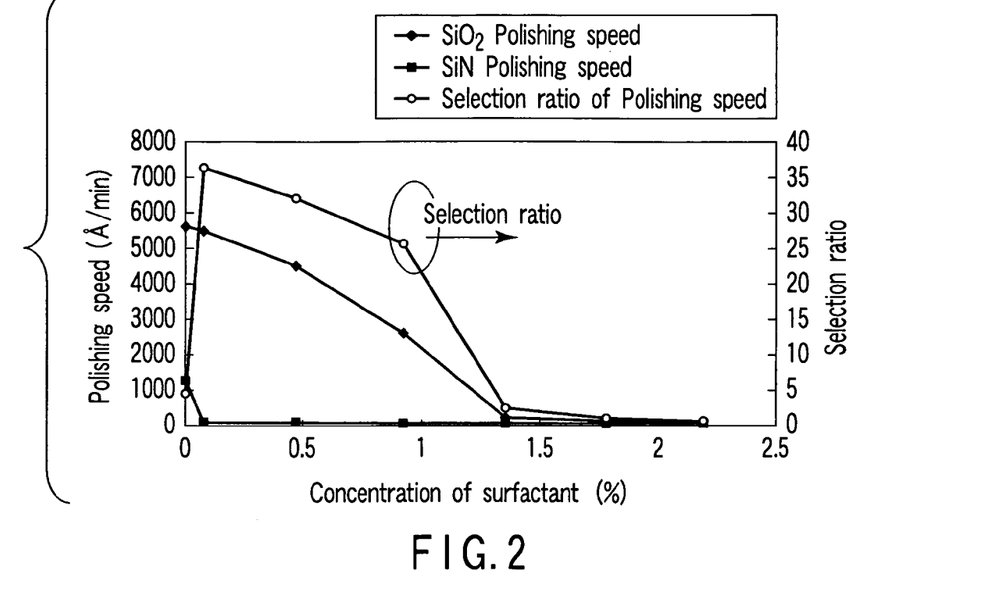
FIG. 2 is a graph showing the polishing speeds of $SiO_2$ and SiN and the selection ratio thereof in a situation where the concentration of ammonium polyacrylate fluctuates in a polishing liquid in the polishing step in the process of forming an element isolation according to one embodiment of the present invention.

FIG. 2 is a graph showing the polishing speeds of $SiO_2$ and SiN and the selection ratio thereof in a situation where 0.5% by weight of ceria was employed and the concentration of ammonium polyacrylate was fluctuated in the polishing liquid.

It will be seen from the graph of FIG. 2 that depending on the concentration of ammonium polyacrylate in the polishing liquid, the polishing speeds of $SiO_2$ and SiN were caused to fluctuate and at the same time, the selection ratio (ratio between polishing speeds) was also caused to fluctuate.

Therefore, in this example, a polishing liquid containing a high concentration of ammonium polyacrylate was employed until the roughness of the surface of substrate was alleviated, thus making good use of the characteristics of this polishing liquid that only the projected portions can be selectively polished. Then, before the polishing was permitted to reach the silicon nitride film, the aforementioned polishing liquid containing ammonium polyacrylate was switched to a different kind of polishing liquid containing a low concentration of ammonium polyacrylate, i.e. a polishing liquid exhibiting a high selection ratio which enables to easily polish the silicon oxide film but is incapable of easily polish the silicon nitride film, thus performing the polishing to reach the silicon nitride film.

By performing a continuous polishing by making use of two kinds of polishing liquids in this manner, it is now made possible to suppress the polishing of a silicon nitride film while making it possible to maintain the characteristics of the conventional method that only the projected portions can be selectively polished. Further, since the polishing speed of the silicon oxide film was enhanced in accomplishing the polishing, it was possible to minimize the number of scratch on the polished surface.

EXAMPLE 2

This example describes one example where the concentration of the surfactant as well as the concentration of the abrasive particles of the polishing liquid were decreased when the polishing in the first stage is switched to the polishing in the second stage.

In the polishing in the first stage, an aqueous dispersion containing 0.5% by weight of ceria and 1.5% by weight of ammonium polyacrylate was employed as a polishing liquid. In the polishing in the second stage, an aqueous dispersion containing 0.3% by weight of ceria and not containing a surfactant was employed as a polishing liquid.

Figure 3:
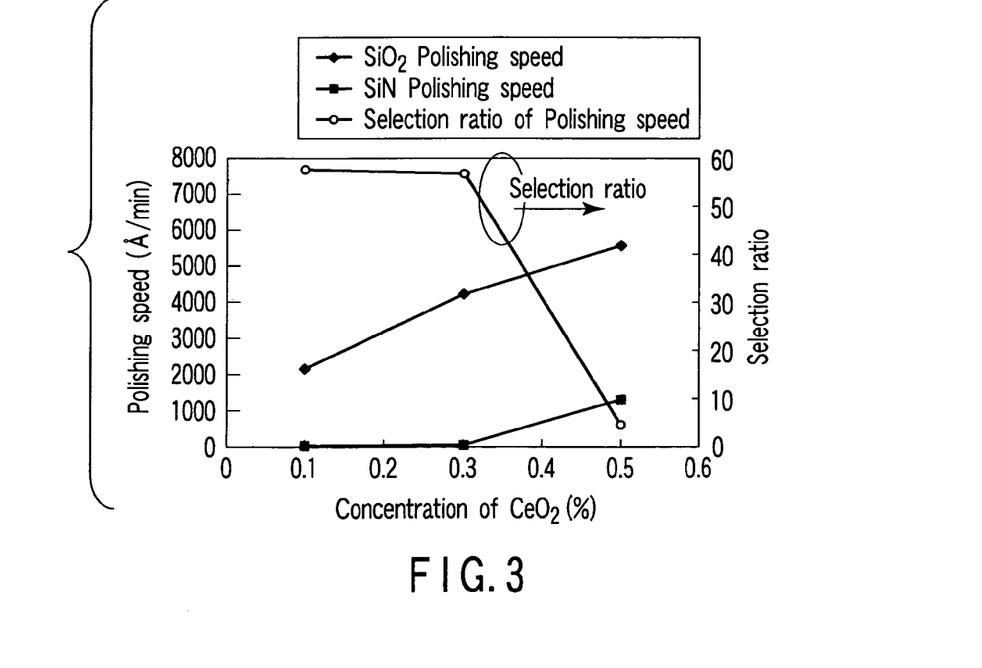
FIG. 3 is a graph showing the polishing speeds of $SiO_2$ and SiN and the selection ratio thereof in a situation where the concentration of abrasive particles fluctuates in a polishing liquid.

FIG. 3 is a graph showing the polishing speeds and the selection ratio of $SiO_2$ and SiN where the concentration of ammonium polyacrylate is set to zero and the concentration of abrasive particles fluctuates in the polishing liquid.

It will be seen from the graph of FIG. 3 that depending on the concentration of ceria particle in the polishing liquid also, the polishing speeds of $SiO_2$ and SiN fluctuate and at the same time, the selection ratio (ratio between polishing speeds) also fluctuates.

Therefore, in this example, a polishing liquid having a high concentration of ammonium polyacrylate and a high concentration] of ceria particle was employed until the roughness of the surface of substrate was alleviated, thus making good use of the characteristics of this polishing liquid that only the projected portions can be selectively polished. Then, before the polishing was permitted to reach the silicon nitride film, the aforementioned polishing liquid containing ammonium polyacrylate was switched to a different kind of polishing liquid having a low concentration of ceria particle and a low concentration of ammonium polyacrylate, i.e. a polishing liquid exhibiting a high selection ratio which enables to easily polish the silicon oxide film but is incapable of easily polish the silicon nitride film, thus performing the polishing to reach the silicon nitride film.

By performing a continuous polishing by making use of two kinds of polishing liquids in this manner, it is now made possible to suppress the polishing of a silicon nitride film while retaining the characteristics of the conventional method that only the projected portions can be selectively polished, thus making it possible to improve the flatness of the polishing surface.

Further, since the silicon oxide was prevented from being polished at an excessively high speed, while greatly improving the selectivity of polishing between the silicon oxide film and the silicon nitride film on the occasion of polishing, it was possible to improve the stability of polishing.

It will be also recognized from the graph of FIG. 3 that the concentration of the abrasive particles in the polishing liquid to be employed may preferably be confined within the range of 0.3 to 1.0% by weight when the abrasive particles is to be employed at a high concentration, and within the range of 0.05 to 0.25% by weight when the abrasive particles is to be employed at a low concentration.

EXAMPLE 3

This example describes one example where the polishing liquid containing an abrasive particles and a surfactant was switched to pure water when the polishing in the first stage is switched to the polishing in the second stage.

In the polishing in the first stage, an aqueous dispersion containing 0.5% by weight of ceria and 1.5% by weight of ammonium polyacrylate was employed as a polishing liquid. In the polishing in the second stage, pure water was employed as a polishing liquid.

Figure 4:
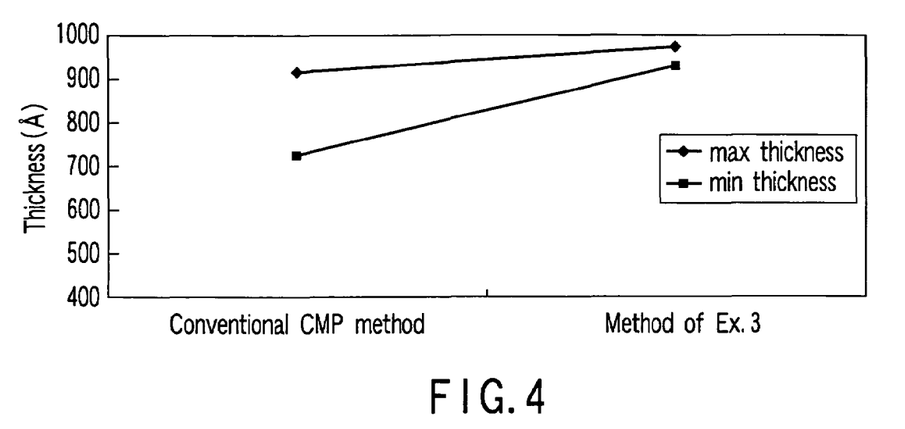
FIG. 4 is a graph illustrating the maximum thickness and the minimum thickness of a silicon nitride film which were derived from the chemical mechanical polishing method according to Example 3 in comparison with those derived from the conventional chemical mechanical polishing.

FIG. 4 shows the maximum thickness and the minimum thickness of a silicon nitride film which were derived from the conventional chemical mechanical polishing method where a polishing liquid containing 0.5% by weight of ceria and 1.5% by weight of ammonium polyacrylate was employed, and from the method according to this example where the polishing liquid containing 0.5% by weight of ceria and 1.5% by weight of ammonium polyacrylate was switched, upon finishing the flattening of the silicon oxide film, to pure water. It will be recognized from FIG. 4 that according to the method of this example, since the selection ratio on the occasion of polishing for removing the silicon oxide film to expose the surface of the silicon nitride film in the polishing of the second stage was enabled to enhance, it was possible to greatly reduce the difference between the maximum thickness and the minimum thickness of the silicon nitride film, thus minimizing the non-uniformity in thickness of the silicon nitride film within a single chip. Incidentally, the reason for this enhancement of the selection ratio through the switching of the polishing liquid to pure water can be attributed to the fact that even though ammonium polyacrylate was eliminated from over the polishing cloth, the ceria was permitted to remain on the polishing cloth, thus enabling the polishing to continue in the presence of only ceria and hence permitting the effects to be derived from the reduction in concentration of the surfactant.

Figure 5:
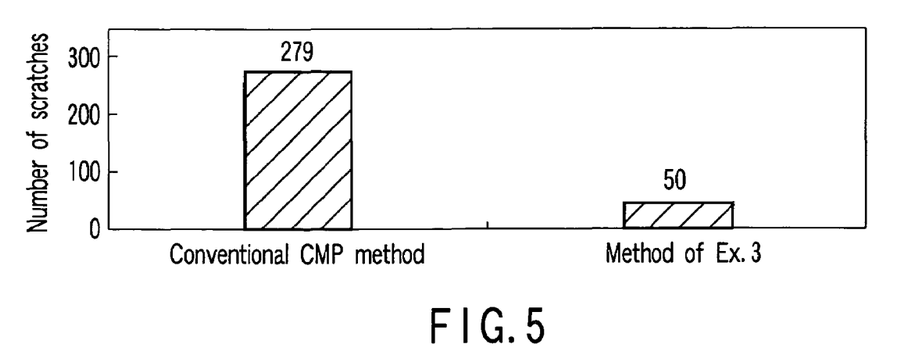
FIG. 5 is a graph illustrating the number of scratches which are generated by the chemical mechanical polishing method according to Example 3 in comparison with that derived from the conventional chemical mechanical polishing.

FIG. 5 shows the number of scratches which was caused to generate from the conventional chemical mechanical polishing method and from the chemical mechanical polishing method according to this example. It will be recognized from FIG. 5 that according to the method of this example, since the polishing speed of the silicon oxide film was increased on the occasion of polishing, the number of scratches on the polishing surface after finishing CMP was greatly reduced to 50 as compared with 279 in number of scratches generated in the conventional CMP method. Incidentally, the reason for this enhancement of the polishing speed of the silicon oxide film through the switching of the polishing liquid to pure water can be attributed to the fact that even though ammonium polyacrylate was eliminated from over the polishing cloth, the ceria was permitted to remain on the polishing cloth, thus enabling the polishing to continue in the presence of only ceria and in the absence of the surfactant which inhibits the polishing.

As explained above, according to this example, the characteristics of polished surface was greatly improved in terms of flatness and the generation of scratches.

EXAMPLE 4

Figure 6:
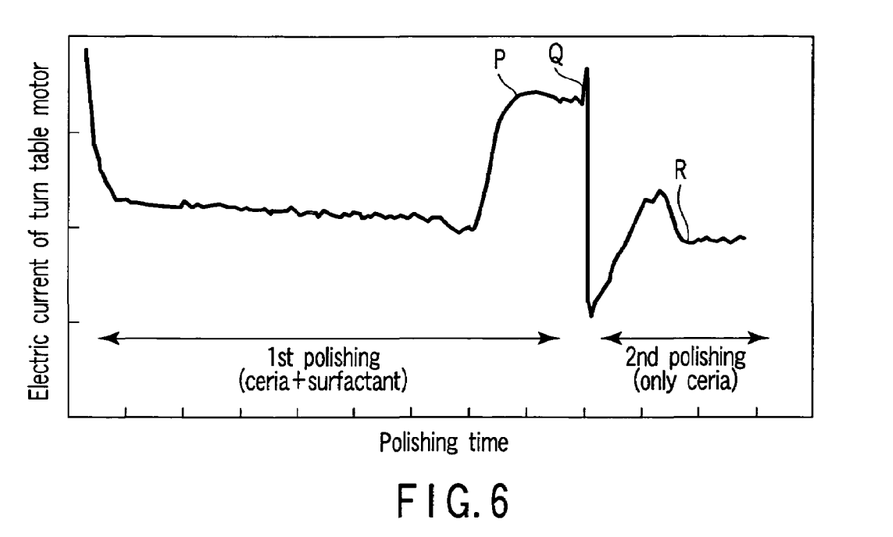
FIG. 6 is a graph illustrating the wave form of the magnitude of electric current of the motor of the turn table in the polishing process in Example 4.

FIG. 6 is a graph illustrating the wave form of the magnitude of electric current of the motor of turning table in the process of polishing. The polishing in the first stage was performed on a silicon oxide film 103 having a recessed/projected surface as shown in FIG. 1A by making use of a polishing liquid containing 0.5% by weight of ceria and 1.1% by weight of ammonium polyacrylate under the polishing condition where the turn table was rotated at 100 rpm in rotational speed.

When the surface of the silicon oxide film 103 became close to flatness in the progress of the polishing in the first stage, the magnitude of electric current of the motor of turn table began to rise. Incidentally, the end point of ascent P of the magnitude of electric current of the motor corresponds to the end point of flattening. After this end point of ascent P of the magnitude of electric current of the motor was detected, the polishing in the first stage was stopped a predetermined time later or at the point Q.

Incidentally, the end point of ascent P of the magnitude of electric current of the motor was determined by drawing at first the differential curve of the magnitude of electric current of the motor and then, by finding the boundary point represented by a bent portion of the curve descending from the peak thereof and then shifted to the flat region thereof.

Then, the polishing conditions were changed to perform the polishing in the second stage. Namely, the polishing was performed with the rotational speed of the polishing table being set to not more than 60 rpm, for example 30 rpm and the concentration of ammonium polyacrylate being set to not higher than 0.31% by weight, for example zero in this example.

Since ammonium polyacrylate was not contained in the polishing liquid in this polishing in the second stage, the magnitude of electric current of the motor was caused to rise in proportion to the progress of the polishing and when the silicon nitride film began to be exposed, the magnitude of electric current of the motor was caused to descend. Incidentally, the end point of descent R of the magnitude of electric current of the motor corresponds to the end point of exposure where the silicon nitride film is entirely exposed. After this end point of descent R of the magnitude of electric current of the motor was detected, the polishing of the second stage was stopped a predetermined time later.

According to the prior art, even if the CVD silicon oxide film is increased in thickness, the conditions of CMP have been set so as to completely remove the residue of the silicon oxide film deposited on the silicon nitride film after finishing CMP. Therefore, in the case of standard film structure, an excessive polishing is caused to generate, thereby enlarging the non-uniformity of the thickness of the silicon nitride film within a single chip.

Figure 7:
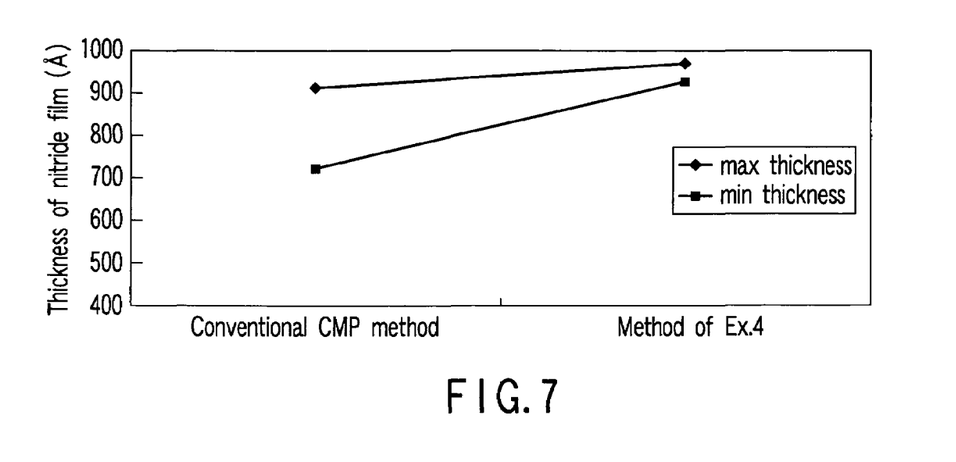
FIG. 7 is a graph illustrating the maximum thickness and the minimum thickness of a silicon nitride film which were derived from the chemical mechanical polishing method according to Example 4 in comparison with those derived from the conventional chemical mechanical polishing.

Whereas, in the case of the method of this example, it was possible to extremely minimize the non-uniformity of the silicon nitride film within a single chip. FIG. 7 shows the maximum thickness and the minimum thickness of a silicon nitride film which were derived from the conventional chemical mechanical polishing method wherein the end point of only one polishing step was detected, and which were derived from the method of this example wherein the end points of two stage of polishing were detected. It will be recognized from FIG. 7 that according to the method of this example, a difference in thickness between the maximum thickness and the minimum thickness of the silicon nitride film was greatly minimized, indicating a very small degree of non-uniformity of the thickness of the silicon nitride film within a single chip.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, which comprises:
    performing a first chemical mechanical polishing of a surface of an object having an uneven surface and disposed on a rotating turn table by making use of a first polishing liquid containing abrasive particles and a surfactant; and
    lowering a rotational speed of the rotating turn table and performing a second chemical mechanical polishing of the surface of said object, which is subjected to said first chemical mechanical polishing, by making use of a second polishing liquid containing abrasive particles and having a concentration of a surfactant lower than that in said first polishing liquid;
    wherein said first chemical mechanical polishing is switched to said second chemical mechanical polishing when said uneven surface of object is flattened.

2. The method according to claim 1, wherein said second polishing liquid contains abrasive particles and a surfactant.

3. The method according to claim 1, wherein switching of polishing from said first chemical mechanical polishing to said second chemical mechanical polishing is performed by a method in which said first polishing liquid is switched to said second polishing liquid which has the concentration of said surfactant lower than that of said first polishing liquid.

4. The method according to claim 1, wherein switching of polishing from said first chemical mechanical polishing to said second chemical mechanical polishing is performed by a method in which water is added to said first polishing liquid to obtain said second polishing liquid.

5. The method according to claim 1, wherein switching of polishing from said first chemical mechanical polishing to said second chemical mechanical polishing is performed by a method in which supply of said first polishing liquid is stopped and then, water is supplied to obtain said second polishing liquid.

6. The method according to claim 1, wherein switching of polishing from said first chemical mechanical polishing to said second chemical mechanical polishing is performed by a method wherein water is added to said first polishing liquid on a polishing cloth to decrease the concentration of said surfactant in said first polishing liquid.

7. The method according to claim 1, wherein said surfactant is an anion surfactant.

8. The method according to claim 7, wherein said anion surfactant is ammonium polyacrylate.

9. The method according to claim 1, wherein a concentration of said surfactant in said first polishing liquid is confined within the range of 0.94 to 3.5% by weight, and a concentration of said surfactant in said second polishing liquid is confined to be not higher than 0.92% by weight.

10. The method according to claim 1, wherein the concentration of said surfactant in said second polishing liquid is confined within the range of 0.08 to 0.62% by weight.

11. The method according to claim 1, wherein said second polishing liquid has a concentration of the abrasive particles lower than that in said first polishing liquid.

12. The method according to claim 11, wherein the concentration of the abrasive particles in said first polishing liquid is confined within the range of 0.3 to 1.0% by weight, and the concentration of the abrasive particles in said second polishing liquid is confined to be not higher than 0.5% by weight.

13. A method for manufacturing a semiconductor device, which comprises:
performing a first chemical mechanical polishing of a surface of an object having an uneven surface by making use of a first polishing liquid containing abrasive particles and a surfactant; and
performing a second chemical mechanical polishing of the surface of said object, which is subjected to said first chemical mechanical polishing, by making use of a second polishing liquid containing abrasive particles and having a concentration of a surfactant lower than that in said first polishing liquid;
wherein said first chemical mechanical polishing is switched to said second chemical mechanical polishing when said uneven surface of object is flattened, the concentration of the abrasive particles in said first polishing liquid is confined within the range of 0.3 to 1.0% by weight, and the concentration of the abrasive particles in said second polishing liquid is confined to 0.05 to 0.25 by weight.

14. The method according to claim 13, wherein said first polishing liquid and said second polishing liquid contain ceria particles as the abrasive particles.

15. The method according to claim 13, wherein said object comprises a silicon substrate having a trench and being covered with a silicon nitride film except said trench and covered with a silicon oxide film to fill said trench with said silicon oxide film, a surface of said silicon oxide film being flattened by said first chemical mechanical polishing and a surface of said silicon nitride film being exposed by said second chemical mechanical polishing.

16. The method according to claim 13, wherein said second chemical mechanical polishing is performed under a polishing load lower than that of said first chemical mechanical polishing.

17. A method for manufacturing a semiconductor device, which comprises:
performing a first chemical mechanical polishing of a surface of an object having an uneven surface by making use of a first polishing liquid containing abrasive particles and a surfactant; and
performing a second chemical mechanical polishing of the surface of said object, which is subjected to said first chemical mechanical polishing, by making use of a second polishing liquid containing abrasive particles and having a concentration of a surfactant lower than that in said first polishing liquid;
wherein said first chemical mechanical polishing is switched to said second chemical mechanical polishing when said uneven surface of object is flattened, said first chemical mechanical polishing and said second chemical mechanical polishing are performed in such a manner that a rotatable press head is pressed onto the object placed on a rotatable abrasive table, that the surface of said object is polished while feeding the polishing liquid to the surface of said abrasive table, that magnitude of electric current of rotating motor of said abrasive table or magnitude of electric current of rotating motor of said press head is monitored during the chemical mechanical polishing, and that a first boundary point and a second boundary point are detected from a curve representing changes with time of said magnitude of electric current, to thereby determine polishing times of said first chemical mechanical polishing and second chemical mechanical polishing.

18. The method according to claim 17, wherein said first boundary point is an end point of ascent in said curve and said second boundary point is an end point of descent in said curve.

19. The method according to claim 18, wherein said object comprises a silicon substrate having a trench and being covered with a silicon nitride film except said trench and covered with a silicon oxide film to fill said trench with said silicon oxide film, a surface of said silicon oxide film being flattened by said first chemical mechanical polishing and a surface of said silicon nitride film being exposed by said second chemical mechanical polishing, termination of flattening of said silicon oxide film being determined by detection of said first boundary point, and completion of exposure of the surface of said silicon nitride film being determined by detection of said second boundary point.

20. The method according to claim 19, wherein the concentration of said surfactant in said second polishing liquid is confined to be not higher than 0.62% by weight.

* * * * *

UNITED STATES PATENT AND TRADEMARK OFFICE
CERTIFICATE OF CORRECTION

| | |
|---|---|
| PATENT NO. | : 7,101,801 B2 |
| APPLICATION NO. | : 10/704628 |
| DATED | : September 5, 2006 |
| INVENTOR(S) | : Ono et al. |

It is certified that error appears in the above-identified patent and that said Letters Patent is hereby corrected as shown below:

Claim 13, column 11, line 65, change "0.25 by" to --0.25% by--.

Signed and Sealed this

Fifth Day of December, 2006

JON W. DUDAS
*Director of the United States Patent and Trademark Office*